US010680313B2

(12) United States Patent
Maeng et al.

(10) Patent No.: US 10,680,313 B2
(45) Date of Patent: Jun. 9, 2020

(54) STACKED ANTENNA MODULE

(71) Applicant: AMOTECH CO., LTD., Namdong-gu, Incheon (KR)

(72) Inventors: Joo-Seung Maeng, Incheon (KR); Ki-Sang Lim, Incheon (KR); Jin-Won Noh, Gwangju (KR); Hyung-Il Baek, Gyeonggi-do (KR); Beom-Jin Kim, Incheon (KR); Yong-Ho Hwang, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 64 days.

(21) Appl. No.: 16/068,178

(22) PCT Filed: Jan. 6, 2017

(86) PCT No.: PCT/KR2017/000212
§ 371 (c)(1),
(2) Date: Jul. 5, 2018

(87) PCT Pub. No.: WO2017/119773
PCT Pub. Date: Jul. 13, 2017

(65) Prior Publication Data
US 2019/0020101 A1 Jan. 17, 2019

(30) Foreign Application Priority Data
Jan. 8, 2016 (KR) .................. 10-2016-0002883

(51) Int. Cl.
*H01Q 1/24* (2006.01)
*H01Q 1/22* (2006.01)
(Continued)

(52) U.S. Cl.
CPC .......... *H01Q 1/243* (2013.01); *H01Q 1/2208* (2013.01); *H01Q 1/362* (2013.01); *H01Q 1/40* (2013.01);
(Continued)

(58) Field of Classification Search
CPC .................................... H01Q 1/243; H01Q 7/08; H01Q 1/40; H01Q 1/526; H01Q 1/362; H01Q 1/2208;
(Continued)

(56) References Cited

U.S. PATENT DOCUMENTS

2006/0262030 A1 11/2006 Bae et al.
2010/0156749 A1* 6/2010 Kim ................ H01Q 1/38
343/866
2015/0325918 A1 11/2015 Ito

FOREIGN PATENT DOCUMENTS

CN 101232125 A 7/2008
CN 103579766 A 2/2014
(Continued)

OTHER PUBLICATIONS

Machine translation of Yuichi JP Publication 2013222264 cited by applicant on IDS Jul. 5, 2018.*
(Continued)

*Primary Examiner* — Hai V Tran
*Assistant Examiner* — Michael M Bouizza
(74) *Attorney, Agent, or Firm* — Baker & Hostetler LLP

(57) ABSTRACT

The present disclosure relates to an antenna module performing near field communication such as NFC and MST, and disclosed is a stacked antenna module that interposes an electromagnetic wave shielding sheet between a lower stacked flexible sheet and an upper stacked flexible sheet in order to implement performance that is equal to or better than that of the conventional antenna upon mounting on a portable terminal composed of a metal material cover, and implements an antenna pattern that winds an electromagnetic wave shielding sheet in the vertical direction thereof by connecting a first radiation pattern and a second radiation pattern formed on the lower stacked flexible sheet and the
(Continued)

upper stacked flexible sheet, respectively, through a connector that penetrates the electromagnetic wave shielding sheet.

12 Claims, 12 Drawing Sheets

(51) Int. Cl.
| | |
|---|---|
| H01Q 1/36 | (2006.01) |
| H01Q 1/52 | (2006.01) |
| H01Q 7/00 | (2006.01) |
| H01Q 1/40 | (2006.01) |
| H01Q 7/08 | (2006.01) |
| H05K 1/16 | (2006.01) |
| H04B 5/00 | (2006.01) |
| H05K 1/02 | (2006.01) |
| H05K 9/00 | (2006.01) |
| H05K 3/46 | (2006.01) |

(52) U.S. Cl.
CPC ............ *H01Q 1/526* (2013.01); *H01Q 7/00* (2013.01); *H01Q 7/08* (2013.01); *H04B 5/0081* (2013.01); *H05K 1/0218* (2013.01); *H05K 1/165* (2013.01); *H05K 9/0081* (2013.01); *H05K 3/4635* (2013.01); *H05K 2201/0154* (2013.01); *H05K 2201/0715* (2013.01); *H05K 2201/0723* (2013.01)

(58) Field of Classification Search
CPC ........ H01Q 7/00; H05K 1/165; H05K 9/0081; H05K 1/0218; H05K 2201/0723; H05K 2201/0154; H05K 3/4635; H05K 2201/0715; H04B 5/0081
See application file for complete search history.

(56) References Cited

FOREIGN PATENT DOCUMENTS

| | | |
|---|---|---|
| CN | 104064318 A | 9/2014 |
| JP | 2005184094 A | 7/2005 |
| JP | 2013-222264 A | 10/2013 |
| JP | 2014-207432 A | 10/2014 |
| KR | 2006-0115530 A | 11/2006 |
| KR | 2010-0072705 A | 7/2010 |
| KR | 2015-0140213 A | 12/2015 |
| TW | 201547103 A | 12/2015 |

OTHER PUBLICATIONS

Office Action issued in Chinese Application No. 201780007788.0, dated Aug. 26, 2019.

\* cited by examiner

STACKED ANTENNA MODULE

CROSS-REFERENCE TO RELATED APPLICATIONS

This application is a National Stage of International patent application PCT/KR2017/000212, filed on Jan. 6, 2017, which claims priority to foreign Korean patent application No. KR 10-2016-0002883, filed on Jan. 8, 2016, the disclosures of which are incorporated by reference in their entirety.

FIELD OF THE INVENTION

The present disclosure relates to a stacked antenna module, and more particularly, to a stacked antenna module that is built in a portable terminal to perform near field communication or electronic payment.

BACKGROUND

Along with technology development, portable terminals, such as a mobile phone, a PDA, a PMP, a navigation, and a laptop, additionally provide the functions, such as a DMB, a wireless internet, a near field communication between the devices, in addition to fundamental functions, such as call, video/music playbacks, and navigation. Accordingly, the portable terminal includes a plurality of antennas for a wireless communication, such as a wireless internet and a Bluetooth.

In addition, there is a recent trend that the functions, such as information exchange between the terminals, payment, ticket reservation, and search, using a near field communication (i.e., NFC, Magnetic Secure Transmission (MST)) are applied to the portable terminal. For this purpose, the portable terminal is mounted with an antenna module for the mobile terminal (i.e., an NFC antenna module) used in a near field communication method. In this time, the NFC antenna module used is one of electronic tags (RFID), and as a non-contact type near filed communication module using a frequency band of about 13.56 MHz, sends data between the terminals at a short distance of about 10 cm. In addition to payment, the NFC is widely used for transmission of product information at a supermarket or a store and travel information for a visitor, transportation, a lock device for access control, etc.

Recently, there is a trend that a cover of a metal material (hereinafter, a metal cover) is increasingly applied to a portable terminal such as a tablet and a mobile phone. In this time, as illustrated in FIG. 1, when the whole rear cover 11 of the portable terminal is formed with a metal material, there is a problem that it is difficult to implement performance of an NFC antenna 13 mounted on a main body 12 of the portable terminal. Accordingly, the research for implementing performance of the NFC antenna continues to proceed.

As an example, as illustrated in FIG. 2, a conventional portable terminal 20 to which a metal cover 21 is applied forms a slit 22 (or an opening portion) on the metal cover for implementing performance of the NFC antenna, and mounts the NFC antenna to partially overlap with the slit 22. Accordingly, it is possible to implement performance of the NFC antenna through a coupling effect between the NFC antenna and the metal cover through the slit 22.

However, when forming a slit or an opening portion in order to implement performance of the NFC antenna, there are the problems in that a manufacturing process of the portable terminal becomes complicated to thus increase manufacturing costs, and the limitation that should reflect a slit or an opening portion in an exterior design occurs.

Meanwhile, as illustrated in FIGS. 3 and 4, as the user circumstance of the portable terminal recently becomes various, a user demand for a structure that can perform a near field communication in the vertical direction (i.e., a side surface of the portable terminal) as well as in the horizontal direction (i.e., a rear surface of the portable terminal) is increasing.

However, as illustrated in FIG. 5, since a conventional NFC antenna 30 is formed in the shape winding a coil pattern 32 on an upper surface of a ferrite sheet 31, there is a problem in that it is difficult to implement antenna performance in the vertical direction thereof.

SUMMARY OF THE INVENTION

The present disclosure is intended to solve the conventional problems, and an object of the present disclosure is to provide a stacked antenna module, which interposes a shielding sheet between stacked flexible sheets, and connects radiation patterns of the stacked flexible sheets through a via hole formed on the shielding sheet to form an antenna pattern in the vertical direction of the shielding sheet.

For achieving the object, the stacked antenna module in accordance with an embodiment of the present disclosure includes a lower stacked flexible sheet on which a first radiation pattern is formed; an electromagnetic wave shielding sheet stacked on an upper portion of the lower stacked flexible sheet; an upper stacked flexible sheet on which a second radiation pattern is formed, and stacked on an upper portion of the electromagnetic wave shielding sheet; and a connector connects the first radiation pattern and the second radiation pattern by penetrating the electromagnetic wave shielding sheet.

In addition, the connector can include a first via hole formed by penetrating one side of the electromagnetic wave shielding sheet and connects the first radiation pattern and the second radiation pattern; and a second via hole formed by penetrating the other side of the electromagnetic wave shielding sheet and connects the first radiation pattern and the second radiation pattern. The connector can connect the first radiation pattern and the second radiation pattern to form an antenna pattern in the vertical direction of the electromagnetic wave shielding sheet. The connector can also connect the first radiation pattern and the second radiation pattern by penetrating the electromagnetic wave shielding sheet and the upper stacked flexible sheet.

In addition, the electromagnetic wave shielding sheet can be formed with the same area and shape as the lower stacked flexible sheet and the upper stacked flexible sheet.

In addition, the upper stacked flexible sheet and the lower stacked flexible sheet can be a polyimide sheet.

In addition, the lower stacked flexible sheet can be stacked on a lower portion of the electromagnetic wave shielding sheet through a first adhesive sheet, and the first radiation pattern can be composed of a plurality of radiation lines and formed on one surface of the lower stacked flexible sheet.

In addition, the stacked antenna module in accordance with an embodiment of the present disclosure can further include a lower protection sheet is located to a lower surface of the lower stacked flexible sheet.

In addition, the stacked antenna module in accordance with an embodiment of the present disclosure can further include a second adhesive sheet having one surface attached to a lower surface of the lower protection sheet and the other surface attached to a rear cover or a main body of a portable terminal.

In addition, the stacked antenna module in accordance with an embodiment of the present disclosure can further include a first terminal composed of a plurality of terminals located corresponding to one side of the plurality of radiation lines, and formed in the lower stacked flexible sheet; and a second terminal composed of a plurality of terminals located corresponding to the other side of the plurality of radiation lines, and formed in the lower stacked flexible sheet.

In addition, the upper stacked flexible sheet can be stacked on an upper portion of the electromagnetic wave shielding sheet through a third adhesive sheet, and the second radiation pattern can be composed of a plurality of radiation lines and formed on one surface of the upper stacked flexible sheet.

In addition, the stacked antenna module in accordance with an embodiment of the present disclosure can further include an upper protection sheet is located to an upper surface of the upper stacked flexible sheet.

In addition, the stacked antenna module in accordance with an embodiment of the present disclosure can further include a third terminal composed of a plurality of terminals located corresponding to one side of the plurality of radiation lines, and formed in the upper stacked flexible sheet; and a fourth terminal composed of a plurality of terminals located corresponding to the other side of the plurality of radiation lines, and formed in the upper stacked flexible sheet.

In addition, the first radiation pattern can be formed on the lower surface of the lower stacked flexible sheet; the second radiation pattern can be formed on the upper surface of the upper stacked flexible sheet; and the connector can connect the first radiation pattern and the second radiation pattern by penetrating the lower stacked flexible sheet, the electromagnetic wave shielding sheet, and the upper stacked flexible sheet.

According to the present disclosure, there are the effects in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus implementing the NFC antenna performance and the MST antenna performance required for the standard in the portable terminal to which the metal cover is applied, and implementing the antenna performance that is equal to or better than that of the conventional NFC antenna module and MST antenna module mounted on the portable terminal to which the cover of a material other than a metal is applied.

In addition, there is the effect in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus implementing the NFC antenna performance and the MST antenna performance in the vertical direction (i.e., the side surface of the portable terminal) thereof as well as in the horizontal direction (i.e., the rear surface of the portable terminal) thereof.

In addition, there is the effect in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus minimizing the deviation between the NFC antenna performance and the MST antenna performance depending upon an angle therebetween.

In addition, there are the effects in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus implementing the antenna (i.e., the NFC antenna, the MST antenna) characteristics more than the minimum reference for performing the NFC communication on the side surface and rear surface of the portable terminal, and maintaining the antenna performance that is equal to or better than that of the case mounted by a non-metal cover.

In addition, there is the effect in that it is possible for the stacked antenna module to interpose the shielding sheet having the same area and shape as the stacked sheet on which the radiation pattern is formed between the stacked sheets, and to connect the radiation patterns through the via hole formed on the shielding sheet, thus minimizing an open area (i.e., an area that cannot form the radiation pattern) because the radiation pattern forming area can be used up to the outermost surface of the stacked antenna module.

In addition, there is the effect in that it is possible for the stacked antenna module to maximize the radiation pattern forming area to minimize the open area, thus increasing the area (or the length) of the radiation pattern to maximize the antenna performance.

DETAILED DESCRIPTION

Figure 1:
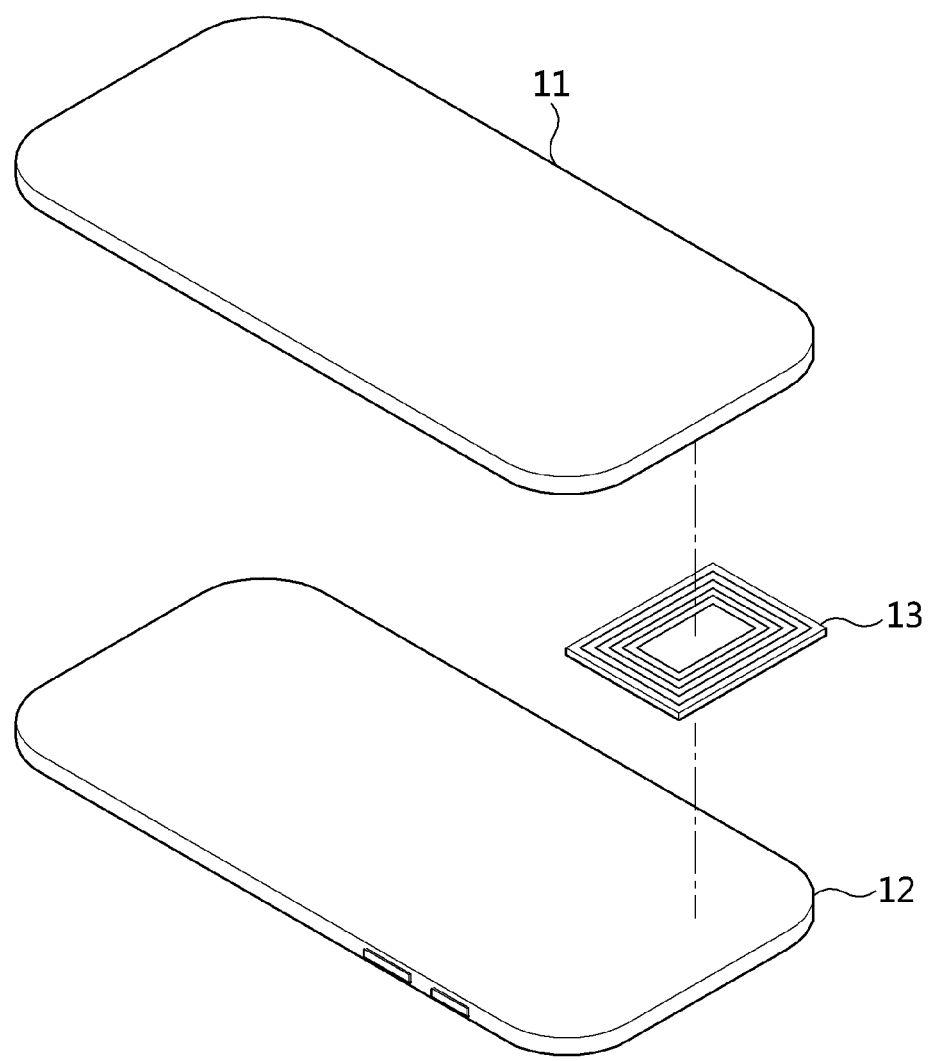
FIGS. 1 to 5 are diagrams for explaining a conventional NFC antenna module.
Figure 2:
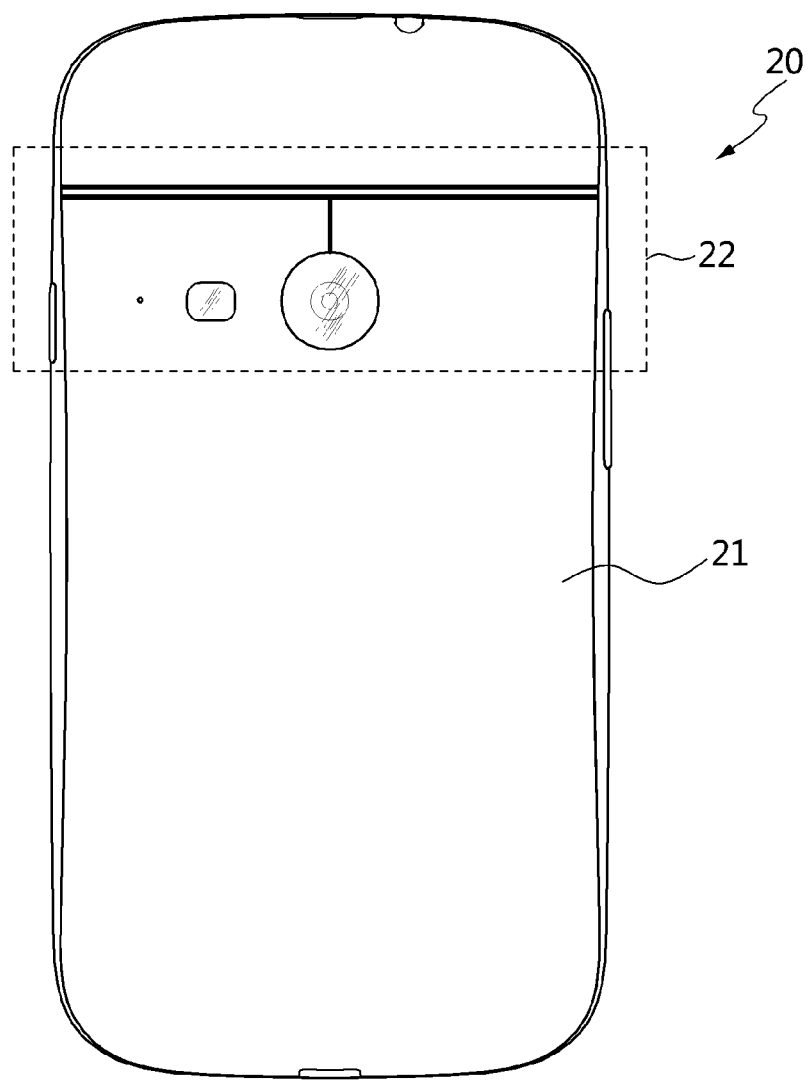
Figure 3:
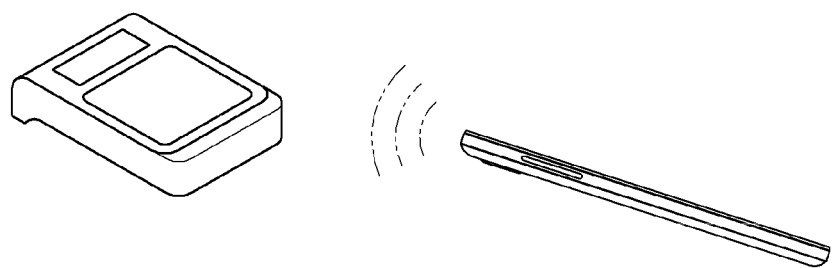
Figure 4:
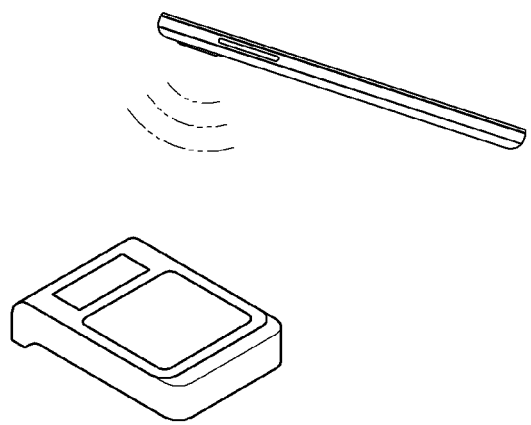
Figure 5:
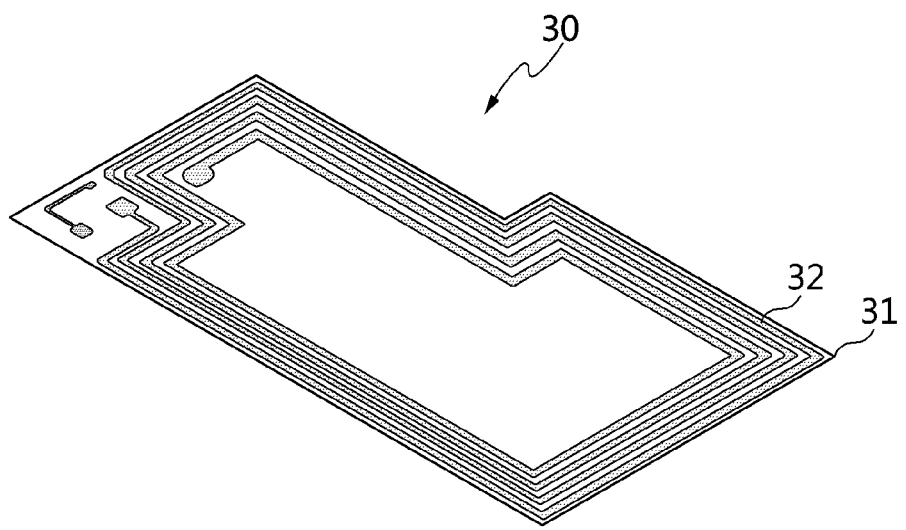

Hereinafter, for detailed explanation to the extent that a person skilled in the art to which the present disclosure pertains can easily embody the technical spirit of the present disclosure, the most preferred embodiments of the present disclosure will be described in detail with reference to the accompanying drawings. First, it should be noted that in denoting reference numerals to the elements in each drawing, the same elements have the same reference numerals if possible even though illustrated in different drawings. Further, in explaining the present disclosure, detailed description of related known configurations and functions will be omitted if it obscures the subject matter of the present disclosure.

Hereinafter, a stacked antenna module in accordance with a first embodiment of the present disclosure will be described in detail with reference to the accompanying drawings.

Figure 6:
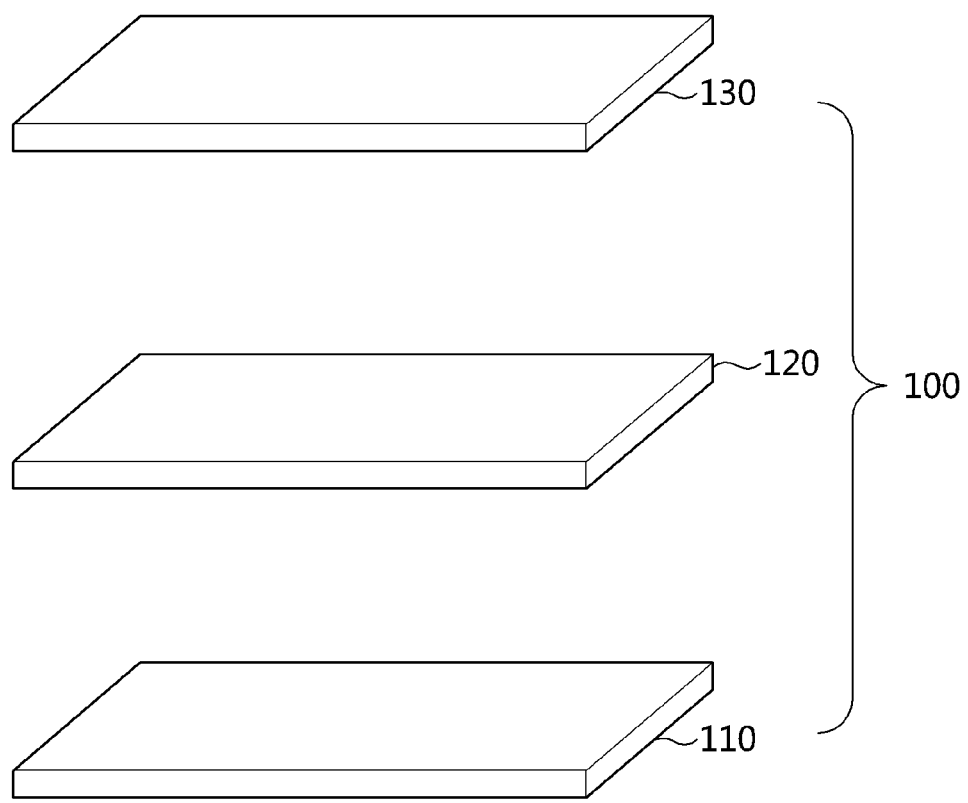
FIG. 6 is a diagram for explaining a stacked antenna module in accordance with a first embodiment of the present disclosure.

As illustrated in FIG. 6, a stacked antenna module 100, as an NFC antenna for near field communication or a Magnetic Secure Transmission (MST) antenna for electronic payment, is configured to include a lower stacked sheet 110, an electromagnetic wave shielding sheet 120, an upper stacked sheet 130, and a connector 140. In this time, the lower stacked sheet 110, the electromagnetic wave shielding sheet 120, and the upper stacked sheet 130 are formed to have the same shape and area. Herein, the lower stacked sheet 110 and the upper stacked sheet 130 correspond to the lower stacked flexible sheet and the upper stacked flexible sheet described in the claims of the present specification, respectively.

Figure 7:
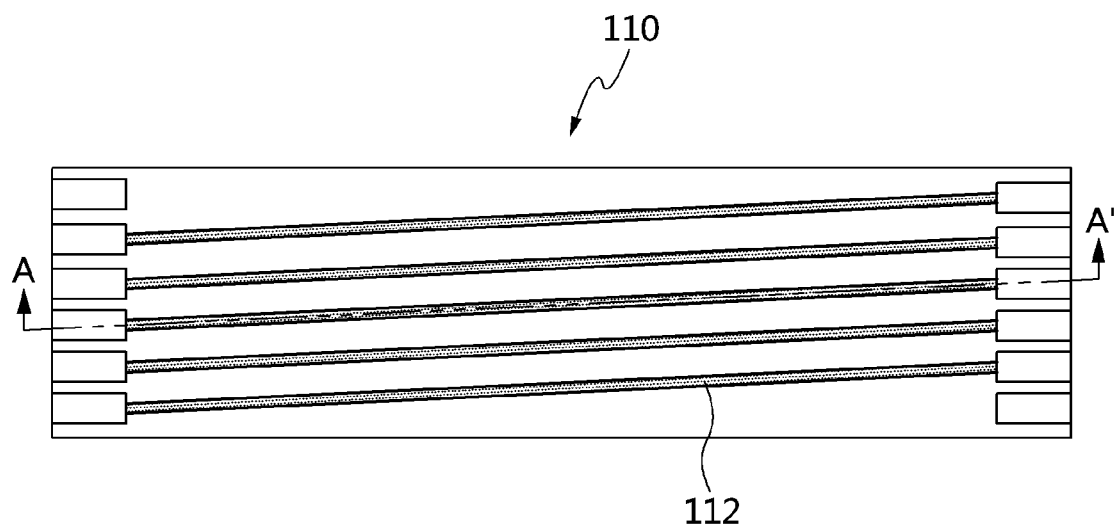
FIGS. 7 and 8 are diagrams for explaining a lower stacked sheet of FIG. 6.

The lower stacked sheet 110 is formed with a flexible printed circuit board, and attached to a rear cover (a metal cover) of the portable terminal or a rear surface of a main body thereof. In this time, referring to FIG. 7, the lower stacked sheet 110 is formed with a first radiation pattern 112 composed of a plurality of radiation lines spaced apart from each other. Herein, for convenience of explanation, FIG. 7 illustrates the state that removes a polyimide sheet and a protection sheet located on a lower portion of the first radiation pattern 112.

Figure 8:
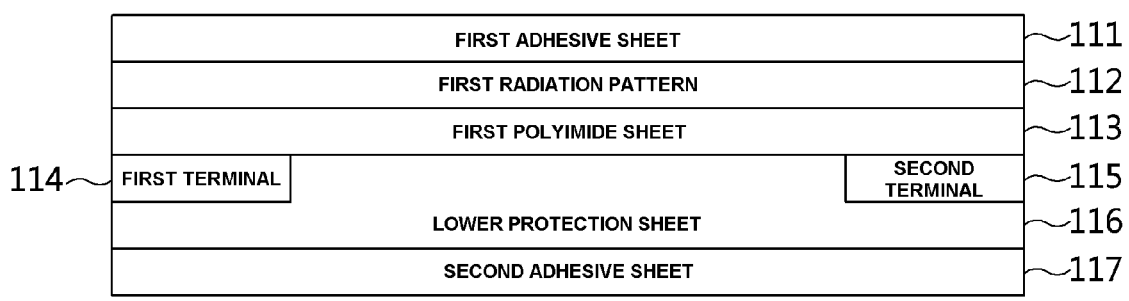

Referring to FIG. 8, in explaining the cut surface (A-A' reference of FIG. 7), the lower stacked sheet 110 is configured to include a first adhesive sheet 111, the first radiation pattern 112, a first polyimide sheet 113, a first terminal 114, a second terminal 115, a lower protection sheet 116, and a second adhesive sheet 117.

The first adhesive sheet 111 is adhered to a lower surface of the shielding sheet. That is, the first adhesive sheet 111 is formed with an adhesive material generally used for configuration of a flexible printed circuit board, such that an upper surface thereof is adhered to the lower surface of the shielding sheet.

The first radiation pattern 112 is located on a lower surface of the first adhesive sheet 111. In this time, the first radiation pattern 112 is formed with a copper material and includes a plurality of radiation lines spaced at a predetermined interval apart from each other. An upper surface of the first radiation pattern 112 is located on the lower surface of the first adhesive sheet 111.

The first polyimide sheet 113 is located on a lower surface of the first radiation pattern 112. That is, an upper surface of the first polyimide sheet 113 is located on the lower surface of the first radiation pattern 112. Herein, an adhesive sheet (not illustrated) can be interposed between the first radiation pattern 112 and the first polyimide sheet 113.

Meanwhile, FIG. 8 illustrates that the first polyimide sheet 113 is located on the lower surface of the first radiation pattern 112 but is not limited thereto, and the first polyimide sheet 113 can be also located on the upper surface of the first radiation pattern 112.

The first terminal 114 is configured to include a plurality of terminals formed with a copper material. The first terminal 114 is located on one side portion of a lower surface of the first polyimide sheet 113. In this time, the plurality of terminals included in the first terminal 114 are located to have a one-to-one correspondence with the plurality of radiation lines constituting the first radiation pattern 112.

The second terminal 115 is configured to include a plurality of terminals formed with a copper material. The second terminal 115 is located on the other side portion of the lower surface of the first polyimide sheet 113. That is, the second terminal 115 is located on the lower surface of the first polyimide sheet 113 like the first terminal 114. The second terminal 115 is located on the other side portion opposite to one side portion on which the first terminal 114 is located. In this time, the plurality of terminals included in the second terminal 115 are located to have a one-to-one correspondence with the plurality of radiation lines constituting the first radiation pattern 112.

Herein, FIG. 8 illustrates that the first terminal 114 and the second terminal 115 are formed on the layer different from the first radiation pattern 112, but the first terminal 114 and the second terminal 115 can be also formed on the same line (layer) as the first radiation pattern 112.

The lower protection sheet 116 is located on the first terminal 114, the second terminal 115, and a lower surface of the first polyimide sheet 113. In this time, the lower protection sheet 116 means Coverlay generally used for a flexible printed circuit board.

The second adhesive sheet 117 is attached to a rear cover of a portable terminal or a rear surface of a main body thereof. That is, the second adhesive sheet 117 is formed with an adhesive material generally used for configuration of a flexible printed circuit board, and an upper surface thereof is attached to the lower surface of the lower protection sheet 116 and a lower surface thereof is attached to a rear cover of a portable terminal or a rear surface of the main body thereof.

The electromagnetic wave shielding sheet 120 is composed of a sheet of an electromagnetic wave blocking material, such as a ferrite sheet. In this time, it has been explained that the electromagnetic wave shielding sheet 120 is composed of the ferrite sheet as an example but is not limited thereto, and a relatively cheap polymer sheet can be used as the electromagnetic wave shielding sheet 120 depending on the application.

The electromagnetic wave shielding sheet 120 is formed to have the same shape and area as the lower stacked sheet 110 and the upper stacked sheet 130. A lower surface of the electromagnetic wave shielding sheet 120 is adhered to an upper surface of the lower stacked sheet 110, and stacked on the upper surface of the lower stacked sheet 110. In this time, the electromagnetic wave shielding sheet 120 is adhered to an upper surface of the first adhesive sheet 111, and stacked on the upper surface of the lower stacked sheet 110.

The upper stacked sheet 130 is formed with a flexible printed circuit board, and stacked on the electromagnetic wave shielding sheet 120. In this time, as illustrated in FIG.

Figure 9:
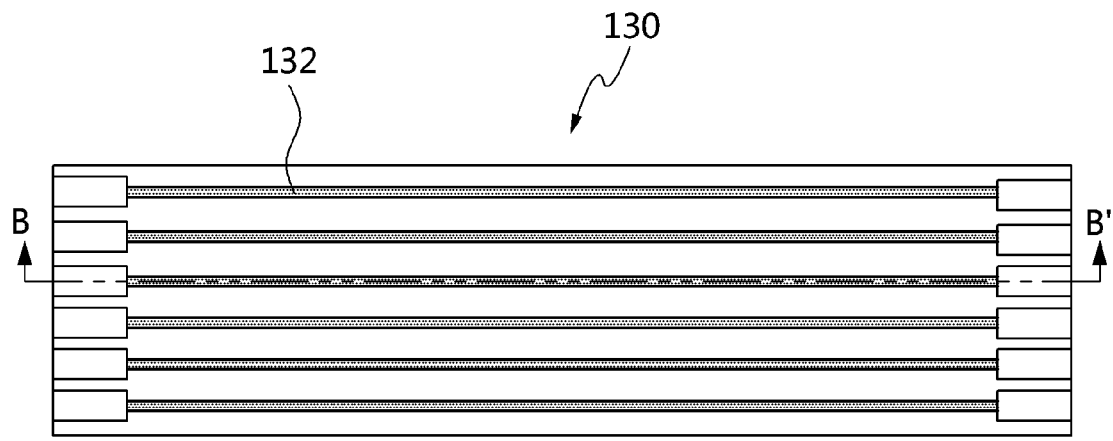
FIGS. 9 and 10 are diagrams for explaining an upper stacked sheet of FIG. 6.

9, the upper stacked sheet 130 is formed with a second radiation pattern 132 composed of a plurality of radiation lines spaced apart from each other. A lower surface of the upper stacked sheet 130 is attached to the electromagnetic wave shielding sheet 120, and stacked on an upper surface of the electromagnetic wave shielding sheet 120. Herein, for convenience of explanation, FIG. 9 illustrates the state that removes a polyimide sheet and a protection sheet located on the upper portion of the second radiation pattern 132.

Figure 10:
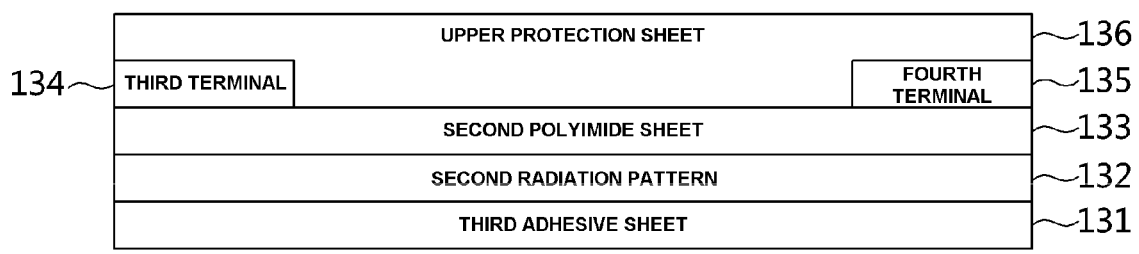

Referring to FIG. 10, in explaining the cut surface (B-B' reference of FIG. 9), the upper stacked sheet 130 is configured to include a third adhesive sheet 131, the second radiation pattern 132, a second polyimide sheet 133, a third terminal 134, a fourth terminal 135, and an upper protection sheet 136.

The third adhesive sheet 131 is adhered to the upper surface of the shielding sheet. That is, the third adhesive sheet 131 is formed with an adhesive material generally used for configuration of a flexible printed circuit board, and a lower surface thereof is adhered to the upper surface of the shielding sheet.

The second radiation pattern 132 is located on an upper surface of the third adhesive sheet 131. In this time, the second radiation pattern 132 is formed with a copper material, and includes a plurality of radiation lines spaced at a predetermined interval apart from each other. A lower surface of the second radiation pattern 132 is located on the upper surface of the third adhesive sheet 131.

The second polyimide sheet 133 is located on an upper surface of the second radiation pattern 132. That is, a lower surface of the second polyimide sheet 133 is located on the upper surface of the second radiation pattern 132. Herein, an adhesive sheet (not illustrated) can be interposed between the second radiation pattern 132 and the second polyimide sheet 133.

Meanwhile, FIG. 10 illustrates that the second polyimide sheet 133 is located on the upper surface of the second radiation pattern 132 but is not limited thereto, and the second polyimide sheet 133 can be also located on the lower surface of the second radiation pattern 132.

The third terminal 134 is configured to include a plurality of terminals formed with a copper material. The third terminal 134 is located on one side portion of an upper surface of the second polyimide sheet 133. In this time, the plurality of terminals included in the third terminal 134 are located to have a one-to-one correspondence with the plurality of radiation lines constituting the second radiation pattern 132.

The fourth terminal 135 is configured to include a plurality of terminals formed with a copper material. The fourth terminal 135 is located on the other side portion of the upper surface of the second polyimide sheet 133. That is, the fourth terminal 135 is located on the lower surface of the second polyimide sheet 133 like the third terminal 134. The fourth terminal 135 is located on the other side portion opposite to one side portion on which the third terminal 134 is located. In this time, the plurality of terminals included in the fourth terminal 135 are located to have a one-to-one correspondence with the plurality of radiation lines constituting the second radiation pattern 132.

Herein, FIG. 10 illustrates that the third terminal 134 and the fourth terminal 135 are formed on the layer different from the second radiation pattern 132, but the third terminal 134 and the fourth terminal 135 can be also formed on the same line (layer) as the second radiation pattern 132.

The upper protection sheet 136 is located on the third terminal 134, the fourth terminal 135, and the upper surface of the second polyimide sheet 133. In this time, the upper protection sheet 136 means Coverlay generally used for a flexible printed circuit board.

The connector 140 electrically connects the first radiation pattern 112 and the second radiation pattern 132. That is, the connector 140 electrically connects the first radiation pattern 112 formed on the lower stacked sheet 110 and the second radiation pattern 132 formed on the upper stacked sheet 130.

Figure 11:
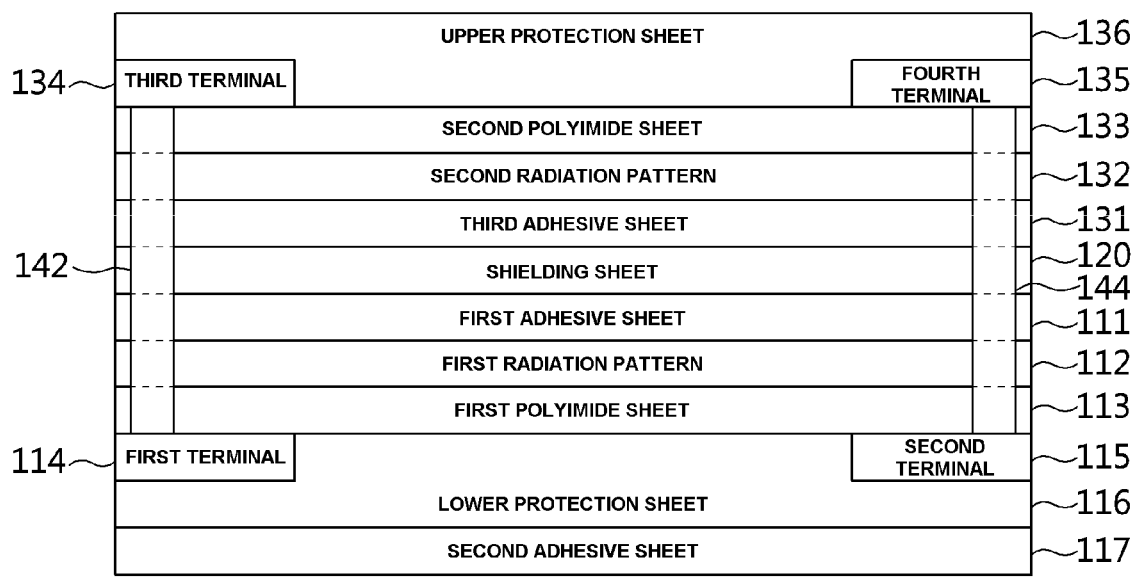
FIG. 11 is a diagram for explaining a connector of FIG. 6.

For this purpose, as illustrated in FIG. 11, the connector 140 is configured to include a first via hole 142 and a second via hole 144.

The first via hole 142 electrically connects the first terminal 114, the first radiation pattern 112, the second radiation pattern 132, and the third terminal 134. That is, the first via hole 142 is formed by penetrating one sides of the first polyimide sheet 113, the first radiation pattern 112 and the first adhesive sheet 111, the shielding sheet 120, the third adhesive sheet 131, the second radiation pattern 132 and the second polyimide sheet 133. The first via hole 142 electrically connects the first terminal 114, the first radiation pattern 112, the second radiation pattern 132, and the third terminal 134 through internal plating.

The second via hole 144 electrically connects the second terminal 115, the first radiation pattern 112, the second radiation pattern 132, and the fourth terminal 135. That is, the second via hole 144 is formed by penetrating the other sides of the first polyimide sheet 113, the first radiation pattern 112 and the first adhesive sheet 111, the shielding sheet 120, the third adhesive sheet 131, the second radiation pattern 132 and the second polyimide sheet 133. The second via hole 144 electrically connects the second terminal 115, the first radiation pattern 112, the second radiation pattern 132, and the fourth terminal 135 through internal plating.

Herein, FIG. 11 illustrates that the terminals 114, 115, 134, 135 are formed on the layers different from the radiation patterns 112, 132 but are not limited thereto, and the terminals 114, 115, 134, 135 can be also located on the same lines (layers) as the radiation patterns 112, 132.

Figure 12:
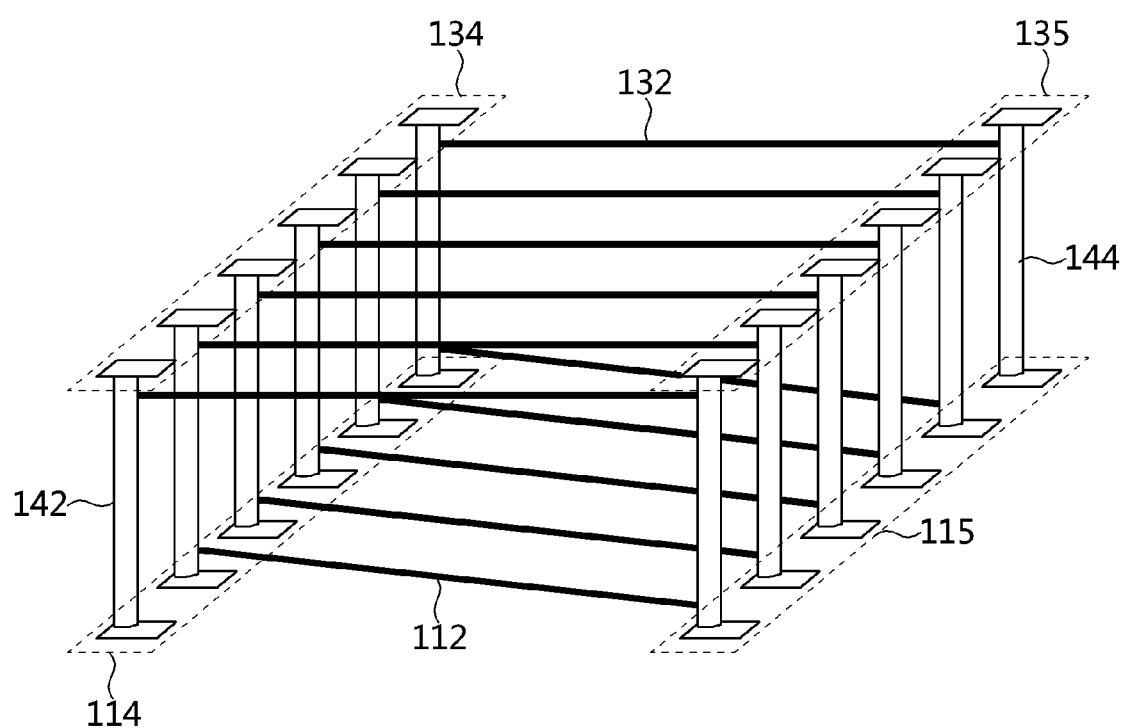
FIGS. 12 and 13 are diagrams for explaining the antenna characteristic of the stacked antenna module in accordance with a first embodiment of the present disclosure.

As described above, as illustrated in FIG. 12, the stacked antenna module 100 connects the radiation patterns formed on the lower stacked sheet 110 and the upper stacked sheet 130 through the via holes to form an antenna pattern having the shape wound in the vertical direction of the electromagnetic wave shielding sheet 120.

Figure 13:
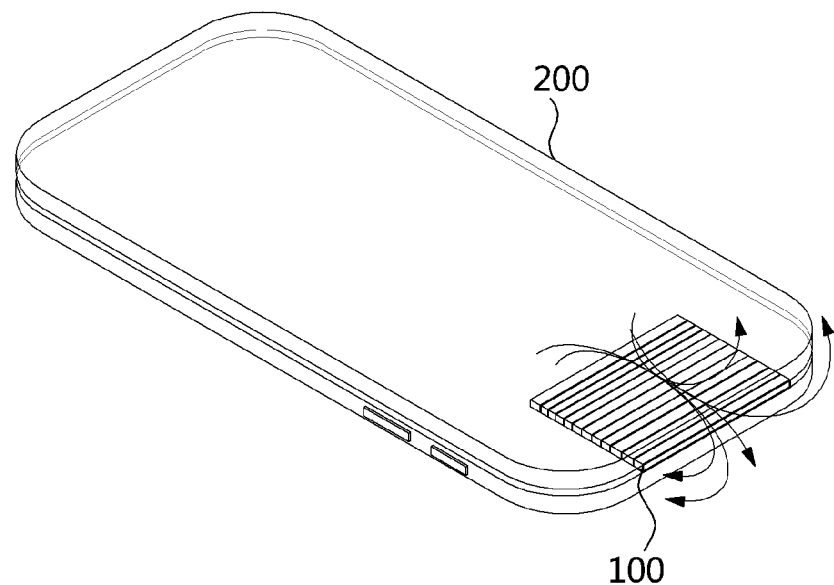

The stacked antenna module 100 is located on a rear surface of a main body of the portable terminal or a rear cover thereof. In this time, as illustrated in FIG. 13, the rear cover of a metal material performs a shielding function, but a radiation field is generated in the horizontal direction thereof and in the vertical direction thereof by an electromagnetic signal that is radiated from a side surface of the stacked antenna module 100.

Accordingly, the stacked antenna module 100 can implement an antenna (i.e., an NFC antenna, a Magnetic Secure Transmission (MST) antenna) characteristic more than a minimum reference for performing an NFC communication on a side surface and rear surface of the portable terminal, and can maintain antenna performance that is equal to or better than that of the case mounted by a non-metal cover.

Hereinafter, a stacked antenna module in accordance with a second embodiment of the present disclosure will be described in detail with reference to the accompanying drawings.

A stacked antenna module 300 is configured to include a lower stacked sheet 310, an electromagnetic wave shielding sheet 320, an upper stacked sheet 330, and a connector 340. In this time, the lower stacked sheet 310, the electromagnetic wave shielding sheet 320, and the upper stacked sheet 330 are formed to have the same shape and area. Herein, the lower stacked sheet 310 and the upper stacked sheet 330 correspond to the lower stacked flexible sheet and the upper stacked flexible sheet described in the claims of the present specification, respectively.

The lower stacked sheet 310 is formed with a flexible printed circuit board, and attached to a rear cover (a metal cover) of a portable terminal or a rear surface of a main body thereof. The lower stacked sheet 310 has a lower surface, which is attached to the rear cover or the rear surface of the main body, formed with a first radiation pattern 311. In this time, the first radiation pattern 311 is composed of a plurality of radiation lines spaced apart from each other.

Figure 14:
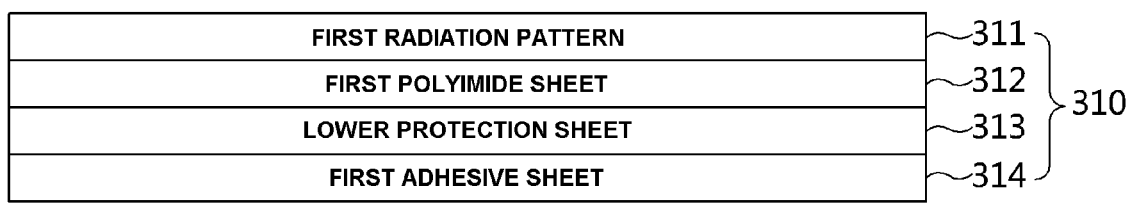
FIG. 14 is a diagram for explaining a lower stacked sheet of the stacked antenna module in accordance with a second embodiment of the present disclosure.

Referring to FIG. 14, in explaining the cut surface, the lower stacked sheet 310 is configured to include the first radiation pattern 311, a first polyimide sheet 312, a lower protection sheet 313, and a first adhesive sheet 314.

The first radiation pattern 311 is located on a lower surface of the electromagnetic wave shielding sheet 320. In this time, the first radiation pattern 311 is formed with a copper material, and includes a plurality of radiation lines spaced at a predetermined interval apart from each other. An upper surface of the first radiation pattern 311 is located on a lower surface of the electromagnetic wave shielding sheet 320.

The first polyimide sheet 312 is located on a lower surface of the first radiation pattern 311. That is, an upper surface of the first polyimide sheet 312 is located on the lower surface of the first radiation pattern 311. Herein, an adhesive sheet (not illustrated) can be interposed between the first radiation pattern 311 and the first polyimide sheet 312.

Meanwhile, FIG. 14 illustrates that the first polyimide sheet 312 is located on the lower surface of the first radiation pattern 311 but is not limited thereto, and the first polyimide sheet 312 can be also located on the upper surface of the first radiation pattern 311.

The lower protection sheet 313 is located on a lower surface of the first polyimide sheet 312. In this time, the lower protection sheet 313 means Coverlay generally used for a flexible printed circuit board.

The first adhesive sheet 314 is attached to a rear cover of a portable terminal or a rear surface of a main body thereof. That is, the first adhesive sheet 314 is formed with an adhesive material generally used for configuration of a flexible printed circuit board, and an upper surface thereof is attached to a lower surface of the lower protection sheet 313 and a lower surface thereof is attached to the rear cover or the rear surface of the main body.

Figure 15:
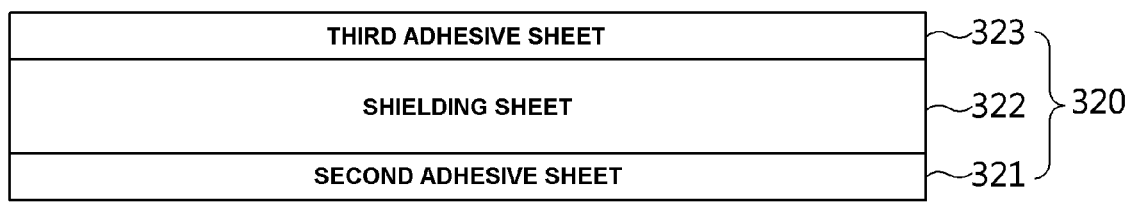
FIG. 15 is a diagram for explaining an electromagnetic wave shielding sheet of the stacked antenna module in accordance with the second embodiment of the present disclosure.

The electromagnetic wave shielding sheet 320 is composed of a sheet of an electromagnetic wave blocking material, such as a ferrite sheet, and stacked on the lower stacked sheet 310. In this time, as illustrated in FIG. 15, the electromagnetic wave shielding sheet 320 is configured to include a second adhesive sheet 321 having a lower surface adhered to an upper surface of the lower stacked sheet 310; a shielding sheet 322 attached to an upper surface of the second adhesive sheet 321; and a third adhesive sheet 323 having a lower surface attached to an upper surface of the shielding sheet 322 and an upper surface attached to a lower surface of the upper stacked sheet 330.

The upper stacked sheet 330 is formed with a flexible printed circuit board, and stacked on the electromagnetic wave shielding sheet 320. An upper surface of the upper stacked sheet 330 is formed with a second radiation pattern 331 composed of a plurality of radiation lines spaced apart from each other.

Figure 16:
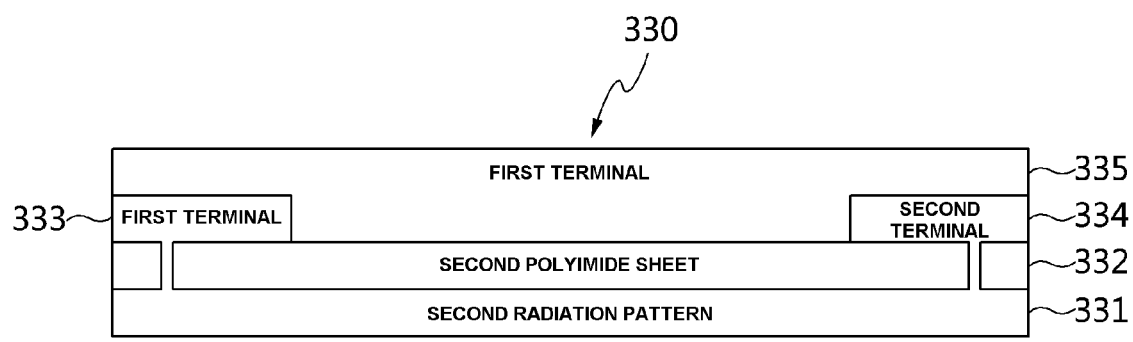
FIG. 16 is a diagram for explaining an upper stacked sheet of the stacked antenna module in accordance with the second embodiment of the present disclosure.

Referring to FIG. 16, in explaining the curt surface of the upper stacked sheet 330, the upper stacked sheet 330 is configured to include the second radiation pattern 331, a second polyimide sheet 332, a first terminal 333, a second terminal 334, and an upper protection sheet 335.

The second radiation pattern 331 is located on the upper surface of the electromagnetic wave shielding sheet 320. In this time, the second radiation pattern 331 is formed with a copper material, and includes a plurality of radiation lines spaced at a predetermined interval apart from each other. A lower surface of the second radiation pattern 331 is located on an upper surface of the third adhesive sheet 323.

The second polyimide sheet 332 is located on an upper surface of the second radiation pattern 331. That is, a lower surface of the second polyimide sheet 332 is located on the upper surface of the second radiation pattern 331. Herein, an adhesive sheet (not illustrated) can be interposed between the second radiation pattern 331 and the second polyimide sheet 332.

Meanwhile, FIG. 16 illustrates that the second polyimide sheet 332 is located on the upper surface of the second radiation pattern 331 but is not limited thereto, and the second polyimide sheet 332 can be also located on the lower surface of the second radiation pattern 331.

The first terminal 333 is configured to include a plurality of terminals formed with a copper material. The first terminal 333 is located on one side portion of an upper surface of the second polyimide sheet 332. In this time, the plurality of terminals included in the first terminal 333 are located to have a one-to-one correspondence with the plurality of radiation lines constituting the second radiation pattern 331. Herein, the first terminal 333 is connected with the second radiation pattern 331 through a via hole.

The second terminal 334 is configured to include a plurality of terminals formed with a copper material. The second terminal 334 is located on the other side portion of the upper surface of the second polyimide sheet 332. That is, the second terminal 334 is located on the lower surface of the second polyimide sheet 332 like the first terminal 333. The second terminal 334 is located on the other side portion opposite to one side portion on which the first terminal 333 is located. In this time, the plurality of terminals included in the second terminal 334 are located to have a one-to-one correspondence with the plurality of radiation lines constituting the second radiation pattern 331. Herein, the second terminal 334 is connected with the second radiation pattern 331 through a via hole.

Herein, FIG. 16 illustrates that the first terminal 333 and the second terminal 334 are formed on the layer different from the second radiation pattern 331 but is not limited thereto, and the first terminal 333 and the second terminal 334 can be also formed on the same line (layer) as the second radiation pattern 331.

The upper protection sheet 335 is located on the first terminal 333, the second terminal 334, and an upper surface of the second polyimide sheet 332. In this time, the upper protection sheet 335 means Coverlay generally used for a flexible printed circuit board.

The connector 340 electrically connects the first radiation pattern 311 and the second radiation pattern 331. That is, the connector 340 electrically connects the first radiation pattern 311 formed on the lower stacked sheet 310 and the second radiation pattern 331 formed on the upper stacked sheet 330.

Figure 17:
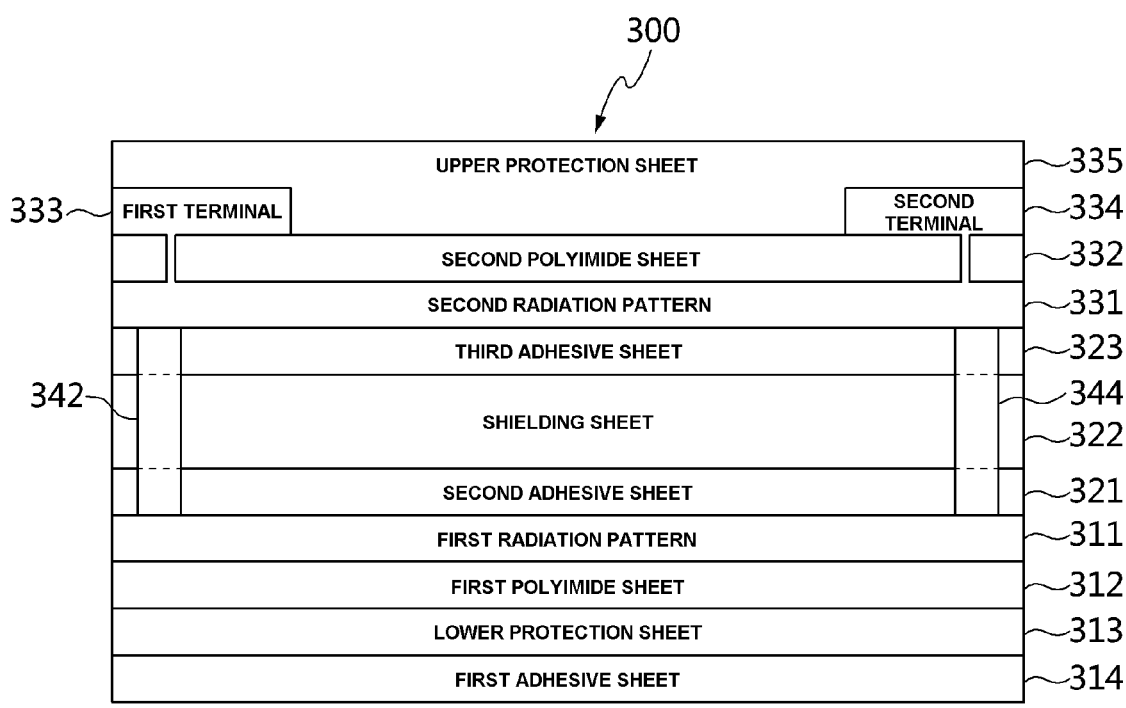
FIG. 17 is a diagram for explaining a connector of the stacked antenna module in accordance with the second embodiment of the present disclosure.

For this purpose, as illustrated in FIG. 17, the connector 340 is configured to include a first via hole 342 formed on one side of the electromagnetic wave shielding sheet 320 and a second via hole 344 formed on the other side of the electromagnetic wave shielding sheet 320.

The first via hole 342 is formed by penetrating one sides of the second adhesive sheet 321, the shielding sheet 322, and the third adhesive sheet 323. That is, the first via hole 342 electrically connects the first radiation pattern 112 and the second radiation pattern 132 through internal plating.

The second via hole 344 is formed by penetrating the other sides of the second adhesive sheet 321, the shielding sheet 322, and the third adhesive sheet 323. The second via hole 344 electrically connects the first radiation pattern 112 and the second radiation pattern 132 through internal plating.

The above-described embodiments have explained that the antenna having the shape winding the electromagnetic wave shielding sheets 120, 320 in the vertical direction is formed to operate as an MST or NFC antenna as an example but are not limited thereto, and another antenna can be additionally formed by extending the lower stacked sheets 110, 310, the electromagnetic wave shielding sheets 120, 320, and the upper stacked sheets 130, 330. As an example, when the antenna having the shape winding the electromagnetic wave shielding sheets 120, 320 in the vertical direction operates as the MST antenna, it can operate as the NFC antenna by forming the radiation pattern on at least one flexible sheet of the lower stacked sheets 110, 310 and the upper stacked sheets 130, 330.

In this time, another antenna additionally formed can be formed on any one of the upper stacked sheet and the lower stacked sheet and composed of the radiation pattern (not illustrated) formed on one surface of the stacked antenna module.

As described above, there are the effects in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus implementing the NFC antenna performance and the MST antenna performance required for the standard in the portable terminal to which the metal cover is applied, and implementing the antenna performance that is equal to or better than that of the conventional NFC antenna module and MST antenna module mounted on the portable terminal to which the cover of a material other than a metal is applied.

In addition, there is the effect in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus implementing the NFC antenna performance and the MST antenna performance in the vertical direction (i.e., the side surface of the portable terminal) thereof as well as in the horizontal direction (i.e., the rear surface of the portable terminal) thereof.

In addition, there is the effect in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus minimizing the deviation between the NFC antenna performance and the MST antenna performance depending upon an angle therebetween.

In addition, there are the effects in that it is possible for the stacked antenna module to stack the stacked sheets on which the radiation pattern is formed on the upper and lower surfaces of the shielding sheet, respectively, and to connect the radiation patterns through the via hole formed on at least one of the shielding sheet and the stacked sheets to form the antenna pattern in the vertical direction of the electromagnetic wave shielding sheet, thus implementing the antenna (i.e., the NFC antenna, the MST antenna) characteristics more than the minimum reference for performing the NFC communication on the side surface and rear surface of the portable terminal, and maintaining the antenna performance that is equal to or better than that of the case mounted by a non-metal cover.

In addition, there is the effect in that it is possible for the stacked antenna module to interpose the shielding sheet having the same area and shape as the stacked sheet on which the radiation pattern is formed between the stacked sheets, and to connect the radiation patterns through the via hole formed on the shielding sheet, thus minimizing an open area (i.e., an area that cannot form the radiation pattern) because the radiation pattern forming area can be used up to the outermost surface of the stacked antenna module.

In addition, there is the effect in that it is possible for the stacked antenna module to maximize the radiation pattern forming area to minimize the open area, thus increasing the area (or the length) of the radiation pattern to maximize the antenna performance.

While the present disclosure has been described with respect to the specific embodiments, it will be apparent to those skilled in the art that various changes and modifications may be made without departing from the spirit and scope of the disclosure as defined in the following claims.

The invention claimed is:

1. A stacked antenna module, comprising:
a lower stacked flexible sheet on which a first radiation pattern is formed;
an electromagnetic wave shielding sheet stacked on an upper portion of the lower stacked flexible sheet;
an upper stacked flexible sheet on which a second radiation pattern is formed, and stacked on an upper portion of the electromagnetic wave shielding sheet;
a connector connects the first radiation pattern and the second radiation pattern by penetrating the electromagnetic wave shielding sheet;
a first terminal formed in the lower stacked flexible sheet; and
a second terminal formed in the lower stacked flexible sheet,
wherein the lower stacked flexible sheet is stacked on a lower portion of the electromagnetic wave shielding sheet through a first adhesive sheet,
wherein the first radiation pattern is composed of a plurality of radiation lines and formed on one surface of the lower stacked flexible sheet, and
wherein the first terminal is composed of a plurality of terminals located corresponding to one side of the plurality of radiation lines, and the second terminal is composed of a plurality of terminals located corresponding to the other side of the plurality of radiation lines.

2. The stacked antenna module according to claim 1, wherein the connector comprises a first via hole formed by penetrating one side of the electromagnetic wave shielding sheet, and connected the first radiation pattern and the second radiation pattern; and a second via hole formed by penetrating the other side of the electromagnetic wave shielding sheet, and connected the first radiation pattern and the second radiation pattern.

3. The stacked antenna module according to claim 2, wherein the connector connects the first radiation pattern and the second radiation pattern to form an antenna pattern in the vertical direction of the electromagnetic wave shielding sheet.

4. The stacked antenna module according to claim 1, wherein the connector connects the first radiation pattern and the second radiation pattern by penetrating the electromagnetic wave shielding sheet and the upper stacked flexible sheet.

5. The stacked antenna module according to claim 1, wherein the electromagnetic wave shielding sheet is formed with the same area and shape as the lower stacked flexible sheet and the upper stacked flexible sheet.

6. The stacked antenna module according to claim 1, wherein the upper stacked flexible sheet and the lower stacked flexible sheet are a polyimide sheet.

7. The stacked antenna module according to claim 1, further comprising a lower protection sheet is located to a lower surface of the lower stacked flexible sheet.

8. The stacked antenna module according to claim 7, further comprising a second adhesive sheet having one surface attached to a lower surface of the lower protection sheet and the other surface attached to a rear cover of a portable terminal or a main body thereof.

9. The stacked antenna module according to claim 1, wherein the upper stacked flexible sheet is stacked on an upper portion of the electromagnetic wave shielding sheet through a third adhesive sheet, and
wherein the second radiation pattern is composed of a plurality of radiation lines and formed on one surface of the upper stacked flexible sheet.

10. The stacked antenna module according to claim 9, further comprising an upper protection sheet is located to an upper surface of the upper stacked flexible sheet.

11. The stacked antenna module according to claim 9, further comprising
a third terminal composed of a plurality of terminals located corresponding to one side of the plurality of radiation lines, and formed in the upper stacked flexible sheet; and
a fourth terminal composed of a plurality of terminals located corresponding to the other side of the plurality of radiation lines, and formed in the upper stacked flexible sheet.

12. The stacked antenna module according to claim 1, wherein the first radiation pattern is formed on a lower surface of the lower stacked flexible sheet,
wherein the second radiation pattern is formed on an upper surface of the upper stacked flexible sheet, and
wherein the connector connects the first radiation pattern and the second radiation pattern by penetrating the lower stacked flexible sheet, the electromagnetic wave shielding sheet, and the upper stacked flexible sheet.

* * * * *